United States Patent [19]

Taniguchi et al.

[11] Patent Number: 5,750,311
[45] Date of Patent: May 12, 1998

[54] IMAGE-FORMABLE MATERIAL WITH RELEASEABLE CUSHION LAYER

[75] Inventors: Tetsuya Taniguchi; Nobumasa Sasa; Kunio Shimizu, all of Hino, Japan

[73] Assignee: Konica Corporation and Mitsubishi Chemical Corporation, Japan

[21] Appl. No.: 584,746

[22] Filed: Jan. 11, 1996

[30] Foreign Application Priority Data

Jan. 18, 1995 [JP] Japan ................................ 7-023501

[51] Int. Cl.$^6$ ...................................................... G03C 3/00
[52] U.S. Cl. ...................................... 430/253; 430/260
[58] Field of Search .................................. 430/253, 260

[56] References Cited

U.S. PATENT DOCUMENTS

| | | | |
|---|---|---|---|
| 5,534,387 | 7/1996 | Bodager et al. | 430/325 |
| 5,609,985 | 3/1997 | Taniguchi et al. | 430/259 |

FOREIGN PATENT DOCUMENTS

| | | |
|---|---|---|
| 3054562 | 3/1991 | European Pat. Off. . |
| 0644459 | 3/1995 | European Pat. Off. . |
| 0655653 | 5/1995 | European Pat. Off. . |

OTHER PUBLICATIONS

Copy of Search Report and Annex EP 96 10 0554.

*Primary Examiner*—Mark Chapman
*Attorney, Agent, or Firm*—Jordan B. Bierman; Bierman, Muserlian and Lucas

[57] ABSTRACT

Disclosed is an image-formable material which comprises a support provided thereon a releasable cushion layer and an image-formable layer in this order, wherein the image-formable layer can be peeled off from the releasable cushion layer, the image-formable layer is transferable, and the releasable cushion layer comprises two or more layers and satisfies all of the following conditions (1), (2) and (3):

(1) a lower layer itself has a Vicat softening temperature measured according to JIS-K7206 of 65° C. or lower;

(2) 65° C.<Vicat softening temperature measured according to JIS-K7206 of uppermost layer resin $\leq$150° C.; and (3) film thickness (μm) of uppermost layer <$[10\log\{(X-65)/230+1\}]^{-1}$ wherein X represents a Vicat softening temperature measured according to JIS-K7206 of an uppermost layer resin.

4 Claims, No Drawings

IMAGE-FORMABLE MATERIAL WITH RELEASEABLE CUSHION LAYER

BACKGROUND OF THE INVENTION

This invention relates to an image-formable material and an image-receiving sheet material which are suitable for forming a color proof for color correction in color printing, and a process for forming a releasable cushion layer to be provided in the above materials, particularly to an image-formable material and an image-receiving sheet material which can give excellent approximation to a print, a wide latitude of image transfer temperature, good image portion-transferring property and excellent suitability for forming a releasable cushion layer, and a process for forming a releasable cushion layer to be provided in the above materials.

In Japanese Provisional Patent Publication No. 97140/1984, there have been disclosed a light-sensitive material and a material for a releasable layer having the same constitutions as in the present invention. However, it has been described as a preferred condition of the releasable layer that the releasable layer has small adhesive strength to a support, and there has merely been described a system in which both of an image and the releasable layer are transferred to an image-receiving sheet at the time of transfer. In this system, the entire surface of a transferred image is finally covered with the resin film of the releasable layer, whereby it is impossible to obtain a finished image as a print in which the surface of a printing paper is exposed at a non-image portion. Thus, image reproducibility is not sufficient as a material in which finished quality similar to a print is required.

In Japanese Provisional Patent Publication No. 148248/1991, there has been disclosed transfer of only an image portion by a direct transfer method, and in Japanese Provisional Patent Publication No. 369691/1992, there has been disclosed transfer of only an image portion by an indirect transfer method.

According to the above techniques, the surface of a paper at a non-image portion is exposed so that an image which is extremely approximate to a print can be obtained. However, a releasable layer is directly contacted with the paper so that the range of temperature and pressure conditions under which transfer can be effected may be extremely narrow depending on the kind of an image-receiving paper, and also a balance between transfer of the image portion and releasability of the non-image portion may not be obtained stably. That is, there is inconvenience that strict management of environment and an apparatus is required, whereby operation load is large.

In Japanese Provisional Patent Publication No. 189535/1986, a non-image portion is not directly contacted with the surface of a paper so that a balance between transfer and releasability can be easily obtained by controlling temperature and pressure conditions at the time of transfer. However, the non-image portion is covered with an organic polymer so that approximation to a print is poor.

On the other hand, as a process for forming a multilayer type releasable cushion layer, there has been known a process (in which a cushion layer is made to have two layers by co-extrusion) disclosed in Japanese Provisional Patent Publication No. 155348/1989. When the film thickness of one layer is 20 μm or less, a stable film thickness cannot be obtained so that properties fluctuate depending on a portion.

Also, there has been known a process (in which a cushion layer is made to have two layers by coating resin solutions) disclosed in Japanese Provisional Patent Publication No. 54562/1991. A resin which is hardly soluble in an organic solvent is used so that it is required to keep the resin solution at a certain temperature or higher or the like, whereby handling is not easy.

Further, adhesion between the layers is not strong so that an upper layer may be lifted or peeled off at the time of coating of an image-formable layer or at the time of transfer.

SUMMARY OF THE INVENTION

A first object of the present invention is to provide an image-formable material and an image-receiving sheet material which can give finished quality approximate to a print and also excellent image reproducibility with respect to a transferred image, i.e., excellent approximation to a print without not only a defect of an image such as transfer failure in evaluation whether or not a manuscript can be faithfully reproduced on a finished proofing sheet, but also covering of a surface at a non-image portion, and a process for forming a releasable cushion layer to be provided in the above materials. A second object of the resent invention is to provide an image-formable material and an image-receiving sheet material which can give a wide latitude of image transfer temperature, good image portion-transferring property and excellent suitability for forming a releasable cushion layer, and a process for forming a releasable cushion layer to be provided in the above materials.

The above objects of the present invention can be accomplished by the following present inventions 1 to 9.

1. An image-formable material which comprises a support provided thereon a releasable cushion layer and an image-formable layer in this order, wherein the image-formable layer can be peeled off from the releasable cushion layer, the image-formable layer is transferable, and the releasable cushion layer comprises two or more layers and satisfies all of the following conditions (1), (2) and (3):

(1) a lower layer itself has a Vicat softening temperature measured according to JIS-K7206 of 65° C. or lower;

(2) 65° C.<Vicat softening temperature measured according to JIS-K7206 of uppermost layer resin (a resin for forming an uppermost layer) ≦150° C.; and (3) film thickness (μm) of uppermost layer <$[10\log\{(X-65)/230+1\}]^{-1}$ wherein X represents a Vicat softening temperature measured according to JIS-K7206 of an uppermost layer resin.

2. The image-formable material of the present invention 1 wherein the uppermost layer contains a polyolefin.

3. An image-formable material which comprises a support provided thereon a releasable cushion layer and an image-formable layer in this order, wherein the image-formable layer can be peeled off from the releasable cushion layer, the image-formable layer is transferable, the releasable cushion layer comprises two or more layers, and an uppermost layer contains a cellulose or a derivative thereof.

4. An image-receiving sheet material which comprises a support and a releasable cushion layer which can receive an image layer formed on an image-formable material and transfer only a received image layer again, provided on the support, wherein the releasable cushion layer comprises two or more layers and satisfies all of the following conditions (1), (2) and (3):

(1) a lower layer itself has a Vicat softening temperature measured according to JIS-K7206 of 65° C. or lower;

(2) 65° C.<Vicat softening temperature measured according to JIS-K7206 of uppermost layer resin <150° C.; and (3) film thickness (am) of uppermost layer <$[10\log\{(X-65)/230+1\}]^{-1}$ wherein X represents a Vicat softening temperature measured according to JIS-K7206 of an uppermost layer resin.

5. The image-receiving sheet material of the present invention 4 wherein the uppermost layer contains a polyolefin or an ethylene-vinyl acetate copolymer.

6. An image-receiving sheet material which comprises a support and a releasable cushion layer which can receive an image layer formed on an image-formable material and transfer only a received image layer again, provided on the support, wherein the releasable cushion layer comprises two or more layers, and an uppermost layer contains a cellulose or a derivative thereof.

7. A process for forming a multilayer type releasable cushion layer comprising two or more layers from which an image-formable layer can be peeled off, on a support, which comprises:

providing an uppermost layer of the releasable cushion layer on a temporary support;

adhering the surface of the uppermost layer to a lower layer provided on the support in a melted state; and removing the temporary support by peeling to make the releasable cushion layer a multilayer.

8. A process for forming a multilayer type releasable cushion layer comprising two or more layers from which an image-formable layer can be peeled off, on a support, which comprises:

after or simultaneously with laminating an upper layer of the releasable cushion layer on a lower layer thereof by coating or superposing, heating the layers under pressurization of 1 kgf/cm² or more at a temperature which is higher than a Vicat softening temperature measured according to JIS-K7206 of either the upper layer or the lower layer itself.

9. A process for forming a releasable cushion layer comprising one or more layers from which an image-formable layer can be peeled off, on a support, which comprises:

forming at least one layer of the releasable cushion layer by using a dispersion in which solid particles of a resin are dispersed in an organic solvent.

With respect to the Vicat softening temperature of the lower layer of the condition (1) in the present invention 1, when the lower layer has a structure such as a multi-layer structure and a sea-island structure, the Vicat softening temperature is an apparent Vicat softening temperature of the entire lower layer including the above structure. The same applies to the Vicat softening temperature of the lower layer of the condition (1) in the present invention 4.

In a conventional technique of transferring only an image to a final support (an image-receiving paper), there is a problem that when a paper having an uneven surface such as a matted paper is used as an image-receiving paper, the range of conditions under which transfer can be effected, i.e., the range of temperature and pressure conditions under which a balance between transfer (conformity with unevenness) of an image portion and releasability from an image-receiving paper at a non-image portion can be obtained is narrow so that strict management of environment and an apparatus is required, whereby operation load is large. The above problem can be solved by the multilayer type releasable cushion layer and the process for forming a multilayer type releasable cushion layer of the present invention, i.e., the range of temperature and pressure conditions under which a balance between transfer (conformity with unevenness) of an image portion and releasability from an image-receiving paper at a non-image portion can be obtained can be widened, whereby operation load can be made small significantly.

As a transfer system, there may be mentioned a direct transfer system in which an image formed on an image-formable material is directly transferred to a final support (an image-receiving paper) and an indirect transfer system in which a formed image is transferred to an image-receiving sheet or the like and then transferred again from the image-receiving sheet to a final support (an image-receiving paper). When the present invention is applied to a releasable cushion layer at the time of transferring an image to a final support, the present invention is effective for either the direct transfer system or the indirect transfer system.

DESCRIPTION OF THE PREFERRED EMBODIMENTS

In the following, the present invention is explained in detail.

The image-formable method of the present invention is to provide a transferred image by subjecting an image-formable material containing a light-sensitive composition and others to image exposure and development to form an image portion and transferring the image portion to a final support (e.g., final printing paper).

When the image-formable method of the present invention is embodied as, for example, a method of forming a multicolor image, a basic method is described below.

In the case of the direct transfer system, after a first color image is formed on a first color image-formable material, the first color image is transferred to a final support and a support of the first color image-formable material is peeled off. After a second color image is formed on a second color image-formable material, the second color image is transferred on the first color image while registration of the second color register mark image formed thereby with the first color register mark image on the final support is conducted and a support of the second color image-formable material is peeled off to obtain an image on which two colors are adjusted. In the same manner, a third color image and a fourth color image are transferred to the final support to obtain a multicolor image.

This kind of method is disclosed in Japanese Provisional Patent Publications No. 41830/1972, No. 97140/1984 and No. 28649/1985 and U.S. Pat. No. 3,775,113.

The image-formable materials of the present inventions 1 to 3 may be used for the image-formable method using the indirect transfer system, but may be principally used for the image-formable method using the direct transfer system.

The image-receiving sheet materials of the present inventions 4 to 6 are used for the image-formable method using the indirect transfer system.

In the image-formable method of the present invention, the image-formable material is generally subjected to image-wise exposure through a color separation mask and then development to form an image. Here, only an image portion of the image obtained on a support is directly or indirectly transferred to and laminated on a final support. In this case, for the purposes of effecting transfer to the final support with good efficiency and facilitating peeling of the support after transfer of the image, the releasable cushion layer according to the present invention is provided on the surface of the support.

The uppermost layer of the releasable cushion layer in the present inventions 1 to 7 refers to a layer which is the farthest from the support in the releasable cushion layer comprising two or more layers. The lower layer refers to all layers other than the uppermost layer in the releasable cushion layer.

As a resin to be used as the lower layer of the present inventions 1 to 6, a resin having a Vicat softening temperature of −30° to 65° C. is preferred. The Vicat softening temperature herein mentioned is a value measured by Method A shown in JIS-K7206-1991. When the lower layer comprises one layer, the Vicat softening temperature of the lower layer is a value obtained by preparing and measuring a test piece having a thickness of 3 mm. When the lower layer comprises plural layers, said temperature is a value obtained by preparing and measuring a test piece in which the thickness of a lowermost layer is increased until the total thickness of the lower layer reaches 3 mm.

As a specific example of the above resin, an ethylene-α-olefin copolymer, an ethylene-vinyl acetate copolymer and an ethylene-ethyl acrylate copolymer each having a Vicat softening temperature of 65° C. or lower, for example, an ethylene-butene copolymer (butene: 22% by weight), an ethylene-vinyl acetate copolymer (vinyl acetate: 33% by weight) and an ethylene-ethyl acrylate copolymer (ethyl acrylate: 25% by weight) may be used singly or as a mixture, may be used as individual layers, may be mixed with polyethylene, polypropylene or the like so that the Vicat softening temperature does not exceed 65° C., or may be used as individual layers. As a process for providing the lower layer on the above support, there may be mentioned the following processes:

(1) the so-called dry lamination process in which a solution obtained by dissolving a resin in an organic solvent is coated on a support and dried by hot air or heating, and then a cover sheet is superposed on the support and pressed under heating to effect lamination;

(2) the so-called hot melt lamination process in which a resin is heated as such and coated on a support according to a doctor blade method, a roll coat method, a gravure method or a reverse roll method while the resin is kept in a melted state, and a cover sheet is superposed on to the support immediately after coating and heated at high temperature then cooled, if necessary, to effect lamination;

(3) the so-called extrusion lamination process in which a resin is heated as such and extruded on a support by an extruder while the resin is kept in a melted state, and a cover sheet is pressed against the support while the resin is in a melted state to effect lamination;

(4) the so-called co-extrusion process in which a layer comprising two or more kinds of resins is formed on a support by one molding using plural extruders or an extruder having plural extrusion ports according to a melt extrusion method, and a cover sheet is pressed against the support while the resins are in a melted state to effect lamination;

(5) the so-called solution-coating process in which a solution obtained by dissolving a resin in an organic solvent or water is coated on a support and dried by hot air or heating; and (6) the process of the present invention 9: a process in which a resin is dissolved under heating in an organic solvent in which a resin is not dissolved at ordinary temperature, the resulting solution is cooled to obtain a dispersion in which solid particles of the resin are dispersed in the organic solvent, and the dispersion is provided on the support by coating, dried and, if necessary, subjected to calendering, whereby fine solid particles of the resin are fused to form a layer. As the cover sheet to be used in the processes (1) to (4), there may be used a material which is the same as the material to be used for the support described below.

It is preferred to select the process of providing the lower layer on the support suitably from the above processes depending on properties of a resin to be used. The thickness of the lower layer is preferably 20 to 70 µm, more preferably 25 to 50 µm.

As a resin to be used as the uppermost layer of the releasable cushion layer of the present inventions 1, 2, 4 and 5, there may be mentioned a polyolefin such as polyethylene, polypropylene, an ethylene-propylene copolymer, an ethylene-α-olefin copolymer and a propylene-α-olefin copolymer, an ethylene-vinyl acetate copolymer, an ethylene-acrylic acid copolymer, an ethylene-propylene-diene copolymer, an ionomer resin, a copolymerized polyamide (nylon), a silicone resin and a fluorine resin.

In the present inventions 2 and 5, the above polyolefin is used singly or as a mixture with other resin. When the polyolefin is used as a mixture with other resin, it is preferred that a mixed solution containing 20% or more of the polyolefin is used.

In the present inventions 1, 2, 4 and 5, the film thickness of the uppermost layer should be a film thickness which does not exceed a film thickness determined by the Vicat softening temperature of the uppermost layer. As the value of the Vicat softening temperature, a value measured by Method A shown in JIS-K7206-1991 is used in the same manner as in the lower layer.

As a resin to be used as the uppermost layer of the releasable cushion layer of the present inventions 3 and 6, there may be mentioned a cellulose such as methyl cellulose, ethyl cellulose, butyl cellulose, hydroxypropyl cellulose and hydroxypropylmethyl cellulose, and a derivative thereof such as a formal compound and an acetal compound thereof.

In the present inventions 1 to 6, as a preferred process for providing the uppermost layer and making the releasable cushion layer a multilayer, there may be mentioned the following processes:

① a process in which a multilayer type releasable cushion layer is obtained by providing an uppermost layer directly on a lower layer previously provided by using the process (1), (2), (5) or (6) described above as the process for providing a lower layer, carrying out the procedures shown in the present invention 8 after or simultaneously with providing the uppermost layer, and removing a temporary support by peeling, if necessary;

② a process in which a multilayer type releasable cushion layer is obtained by providing an uppermost layer on a temporary support according to the process (1), (2), (5) or (6) described above as the process for providing a lower layer, superposing the surface of the uppermost layer on a lower layer provided according to the process (1), (5) or (6), carrying out the procedures shown in the present invention 8 after or simultaneously with superposing, and removing the temporary support by peeling; and ③ the process of the present invention 7 in which a multilayer type releasable cushion layer is obtained by providing an uppermost layer on a temporary support according to the process (1), (2), (5) or (6) described above as the process for providing a lower layer, superposing the surface of the uppermost layer on a lower layer provided according to the process (2), (3) or (4) while the lower layer is in a melted state, and removing the temporary support by peeling.

By using the above processes ①  to ③, i.e., by using the process of the present invention 8 (the above processes ① and ②) or the present invention 9 (the above process ③), it is possible to obtain a multilayer type releasable cushion layer in which although the uppermost layer has a film thickness of 20 µm or less, fluctuation in film thickness is small, and adhesion between the uppermost layer and the lower layer is strong.

As a material of the support to be used in the image-formable materials of the present inventions 1 to 3 and the image-receiving sheet materials of the present inventions 4 to 6 and that of the temporary support to be used in the present invention 7, any material may be used, but a polyester film, particularly a biaxially stretched polyethylene terephthalate film is preferred from the points of strength, dimensional stability to water and heat and economy. In addition to the above film, an acetate film, a polyvinyl chloride film, a polyethylene film and a polypropylene film may be used. The thickness of the above film is not particularly limited. However, from the points of operatability and economy, the thickness is preferably about 50 to 150 µm when the film is used as a support, and it is preferably about 10 to 50 µm when the film is used as a temporary support.

In the image-formable layer in the image-formable material of the present invention, a light-sensitive composition having sensitivity to active light may be used. The image-formable layer may have a single layer structure or a multilayer structure comprising two or more layers. In the case of the multilayer structure, it is sufficient that at least one layer has image-forming property, and a coloring agent such as a pigment and a dye may be contained in one layer or all layers.

As the light-sensitive composition to be used in the image-formable layer of the present invention, a known positive type light-sensitive composition or negative type light-sensitive composition may be used. As the positive type light-sensitive composition, a light-sensitive composition comprising an o-quinonediazide compound is preferably used. As the o-quinonediazide compound, any o-quinonediazide compound may be used so long as it can function as a light-sensitive agent.

As the o-quinonediazide compound, there may be suitably used, for example, a compound obtained by condensing 1,2-benzoquinonediazide-4-sulfonyl chloride, 1,2-naphthoquinonediazide-4-sulfonyl chloride, 1,2-naphthoquinonediazide-5-sulfonyl chloride or 1,2-naphthoquinonediazide-6-sulfonyl chloride with a compound having a hydroxyl group and/or an amino group.

As the compound having a hydroxyl group, there may be mentioned, for example, trihydroxybenzophenone, dihydroxyanthraquinone, bisphenol A, a phenol novolak resin, a resorcin benzaldehyde condensed resin and a pyrogallol acetone condensed resin. As the compound having an amino group, there may be mentioned, for example, aniline, p-aminodiphenylamine, p-aminobenzophenone, 4,4'-diaminodiphenylamine and 4,4'-diaminobenzophenone.

In addition to the above-mentioned, the o-quinonediazide compound is further described in J. Kosar, "Light-sensitive System" (published by John Willy & Sons Co. (New York) in 1965) and Nagamatsu and Inui, "Light-sensitive Polymer" (published by Kodansha (Japan) in 1977).

As the negative type light-sensitive composition, a photopolymerization type light-sensitive composition is preferred. As a photopolymerizable compound to be used in the composition, there may be used any photopolymerizable compound which has been generally used. For example, at least one compound optionally selected from the compound group consisting of acrylic acid, methacrylic acid, an acrylic acid ester and a methacrylic acid ester may be used. There may be mentioned, for example, ethylene glycol diacrylate, glycerin triacrylate, polyacrylate, ethylene glycol dimethacrylate, 1,3-propanediol dimethacrylate, 1,2,4-butanetriol trimethacrylate, polyethylene glycol dimethacrylate, trimethylolethane triacrylate, pentaerythritol dimethacrylate, pentaerythritol trimethacrylate, pentaerythritol tetramethacrylate, pentaerythritol diacrylate, pentaerythritol triacrylate, pentaerythritol tetraacrylate, dipentaerythritol polyacrylate, 1,3-propanediol diacrylate, 1,5-pentanediol dimethacrylate and polyethylene glycol bisacrylate and bismethacrylate, but the present invention is not limited thereby.

In the negative type light-sensitive composition, a photopolymerization initiator may be contained. Any photopolymerization initiator may be used, but a photopolymerization initiator which absorbs less light at a visible portion is preferred. As an example of such a photopolymerization initiator, there may be mentioned the following compounds, but the present invention is not limited thereby. The compounds are an aromatic ketone such as benzophenone, Michler's ketone (4',4'-bis(dimethylamino)benzophenone), 4,4'-bis(diethylamino)benzophenone, 4-methoxy-4'-dimethylaminobenzophenone, 2-ethylanthraquinone, phenanthraquinone and other aromatic ketones;

a benzoin ether such as benzoin, benzoin methyl ether, benzoin ethyl ether and benzoin phenyl ether;

a benzoin such as methyl benzoin, ethyl benzoin and other benzoins; and an imidazole dimer such as a 2-(o-chlorophenyl)-4,5-diphenylimidazole dimer, a 2-(o-chlorophenyl)-4,5-(m-methoxyphenyl)imidazole dimer, a 2-(o-fluorophenyl)-4,5-diphenylimidazole dimer, a 2-(o-methoxyphenyl)-4,5-diphenylimidazole dimer, a 2-(p-methoxyphenyl)-4,5-diphenylimidazole dimer, a 2,4-di(p-methoxyphenyl)-5-phenylimidazole dimer, a 2-(2,4-dimethoxyphenyl)-4,5-diphenylimidazole dimer, a 2-(p-methylmercaptophenyl)-4,5-diphenylimidazole dimer and a 2,4,5-triacrylimidazole dimer which is similar to dimers described in U.S. Pat. No. 3,479,185, U.K. Patent No. 1,047,569 and U.S. Pat. No. 3,784,557.

As other photopolymerizable compound, a thioxanthone such as 2,4-diethylthioxanthone may be used. In this case, as a photopolymerization accelerator, a known compound, for example, isoamyl p-dimethylaminobenzoate, ethyl p-dimethylaminobenzoate, N-methyldiethanolamine or bis-diethylaminobenzophenone may be used.

The light-sensitive composition of the present invention may contain a known polymeric compound and a synthetic resin. It is preferred that a polymeric compound having a vinyl carboxylate polymer unit represented by the following formula in its molecular structure is contained.

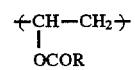

wherein R represents an alkyl group or a substituted alkyl group.

Any polymeric compound having a structure as described above may be used, but as a vinyl carboxylate monomer for constituting the polymer unit represented by the above formula, the following exemplary monomers are preferred. Compound names and chemical formulae thereof are shown below.

| 1. | Vinyl acetate | $CH_3COOCH=CH_2$ |
|---|---|---|
| 2. | Vinyl propionate | $CH_3CH_2COOCH=CH_2$ |
| 3. | Vinyl butyrate | $CH_3(CH_2)_2COOCH=CH_2$ |
| 4. | Vinyl pivalate | $(CH_3)_3CCOOCH=CH_2$ |
| 5. | Vinyl caproate | $CH_3(CH_2)_4COOCH=CH_2$ |
| 6. | Vinyl caprylate | $CH_3(CH_2)_6COOCH=CH_2$ |
| 7. | Vinyl caprinate | $CH_3(CH_2)_8COOCH=CH_2$ |
| 8. | Vinyl laurate | $CH_3(CH_2)_{10}COOCH=CH_2$ |
| 9. | Vinyl myristate | $CH_3(CH_2)_{12}COOCH=CH_2$ |
| 10. | Vinyl palmitate | $CH_3(CH_2)_{14}COOCH=CH_2$ |
| 11. | Vinyl stearate | $CH_3(CH_2)_{16}COOCH=CH_2$ |
| 12. | Vinyl versatate | $R^1-\underset{R^2}{\underset{|}{\overset{CH_3}{\overset{|}{C}}}}-COOCH=CH_2$ | wherein $R^1$ and $R^2$ each represent an alkyl group and the total carbon number of $R^1$ and $R^2$ is 7, i.e., $R^1+R^2=C_7H_{16}$.

The polymeric compound may be either a polymer obtained by polymerizing one vinyl carboxylate, a copolymer obtained by copolymerizing two kinds of vinyl carboxylates or a copolymer of vinyl carboxylate and other monomer which can be copolymerized with vinyl carboxylate with any component ratio.

As a monomer unit which can be used in combination with the polymer unit represented by the above formula, there may be mentioned an ethylenic unsaturated olefin such as ethylene, propylene, isobutylene, butadiene and isoprene;

a styrene such as styrene, α-methylstyrene, p-methylstyrene and p-chlorostyrene;

an acrylic acid such as acrylic acid and methacrylic acid;

an unsaturated aliphatic dicarboxylic acid such as itaconic acid, maleic acid and maleic anhydride;

a diester of an unsaturated dicarboxylic acid such as diethyl maleate, dibutyl maleate, di-2-ethylhexyl maleate, dibutyl fumarate and di-2-ethylhexyl fumarate;

an α-methylene aliphatic monocarboxylate such as methyl acrylate, ethyl acrylate, n-butyl acrylate, isobutyl acrylate, phenyl acrylate, methyl α-chloroacrylate, methyl methacrylate and ethyl methacrylate;

a nitrile such as acrylonitrile and methacrylonitrile;

an amide such as acrylamide;

an anilide such as acrylanilide, p-chloroacrylanilide, m-nitroacrylanilide and m-methoxyacrylanilide;

a vinyl ether such as methyl vinyl ether, ethyl vinyl ether, isobutyl vinyl ether and β-chloroethyl vinyl ether;

vinyl chloride, vinylidene chloride and vinylidene cyanide;

an ethylene derivative such as 1-methyl-1-methoxyethylene, 1,1-dimethoxyethylene, 1,2-dimethoxyethylene, 1,1-dimethoxycarbonylethylene and 1-methyl-1-nitroethylene; and a vinyl type monomer such as a N-vinyl compound (e.g., N-vinylpyrrole, N-vinylcarbazole, N-vinylindole, N-vinylpyrrolidene and N-vinylpyrrolidone). These monomer units exist in the polymeric compound in a structure of a cleaved double bond.

As the polymeric compound to be used in the present invention, polymeric compounds having a vinyl acetate polymer unit in a molecular structure are particularly preferred. Among them, preferred are those having 40 to 95% by weight of a vinyl acetate polymer unit, a number average molecular weight (MN) of 1,000 to 60,000 and a weight average molecular weight (MW) of 500 to 150,000.

More preferred is a polymeric compound having a vinyl acetate polymer unit (particularly having 40 to 95% by weight of said unit) and a polymer unit of vinyl carboxylate having a chain longer than that of vinyl acetate, particularly having a number average molecular weight (MN) of 2,000 to 60,000 and a weight average molecular weight (MW) of 10,000 to 150,000.

In this case, a monomer which is copolymerized with vinyl acetate to constitute the polymeric compound having a vinyl acetate polymer unit may be any monomer so long as it is copolymerizable. The monomer can be optionally selected from, for example, the above exemplary monomers.

In the following, copolymers which can be used as the polymeric compound in the present invention are enumerated by showing monomer components thereof. As a matter of course, the present invention is not limited thereby.

1. Vinyl acetate-ethylene
2. Vinyl acetate-styrene
3. Vinyl acetate-crotonic acid
4. Vinyl acetate-maleic acid
5. Vinyl acetate-2-ethylhexyl acrylate
6. Vinyl acetate-di-2-ethylhexyl maleate
7. Vinyl acetate-methyl vinyl ether
8. Vinyl acetate-vinyl chloride
9. Vinyl acetate-N-vinylpyrrolidone
10. Vinyl acetate-vinyl propionate
11. Vinyl acetate-vinyl pivalate
12. Vinyl acetate-vinyl versatate
13. Vinyl ac etate-vinyl laurate
14. Vinyl acetate-vinyl stearate
15. Vinyl ac etate-vinyl versatate-ethylene
16. Vinyl acetate-vinyl versatate-2-ethylhexyl acrylate
17. Vinyl acetate-vinyl versatate-vinyl laurate
18. Vinyl ac etate-vinyl versatate-crotonic acid
19. Vinyl propionate-vinyl versatate
20. vinyl propionate-vinyl versatate-crotonic acid
21. Pivalic acid-vinyl stearate-maleic acid By using the light-sensitive composition of the present invention, an image-formable material can be prepared. For example, a color image-formable material which is used as a color proof can be prepared.

In this case, an image-formable layer, i.e., a color light-sensitive layer of the color image-formable material is removed imagewisely by development after imagewise exposure to form a color image portion.

To the color light-sensitive layer, a dye and/or a pigment is/are added as a coloring agent. Particularly when the color image-formable material is used for color correction, pigments and/or dyes having color tones corresponding to ordinary colors required for color correction, i.e., yellow, magenta, cyan and black are required, and also other metallic powders, a white pigment and a fluorescent pigment are used. When the present invention is applied to a color proof, the following various pigments and dyes which have been conventionally known in this field of the art may be used.

(C.I means a color index.)

| | |
|---|---|
| Victoria Pure Blue | (C.I 42595) |
| Auramine | (C.I 41000) |
| Carotene Brilliant Flavin | (C.I Basic 13) |
| Rhodamine 6GCP | (C.I 45160) |
| Rhodamine B | (C.I 45170) |
| Safranine OK 70:100 | (C.I 50240) |
| Erioglaucine X | (C.I 42080) |
| Fast Black HB | (C.I 26150) |
| No. 1201 Lionol Yellow | (C.I 21090) |
| Lionol Yellow GRO | (C.I 21090) |
| Symlar Fast Yellow 8GF | (C.I 21105) |
| Benzidine Yellow 4T-564D | (C.I 21095) |
| Symlar Fast Red 4015 | (C.I 12355) |
| Lionol Red 7B4401 | (C.I 15830) |
| Fastgen Blue TGR-L | (C.I 74160) |
| Lionol Blue SM | (C.I 26150) |

Mitsubishi Carbon Black MA-100 (trade name, produced by Mitsubishi Chemical Corporation)

Mitsubishi Carbon Black #30, #40 and #50 (trade names, produced by Mitsubishi Chemical Corporation)

When the coloring agent is used, the ratio of the coloring agent to components other than the coloring agent in the color light-sensitive layer can be determined according to a method known to those skilled in the art in consideration of target optical density and removing property to a developing solution of the color light-sensitive layer. For example, in the case of a dye, the ratio is preferably 5% to 75% in terms of weight and in the case of a pigment, the ratio is preferably 5% to 90% in terms of weight.

The film thickness of the color light-sensitive layer can be determined according to a method known to those skilled in the art in consideration of target optical density, the kind of the coloring agent (dye, pigment or carbon black) used in the color light-sensitive layer and a content thereof. The film thickness is generally preferably in the range of 0.1 g/m² to 5 g/m².

When the present invention is practiced, a plasticizer and a coatability improving agent may be further added to the light-sensitive composition, if necessary.

As the plasticizer, there may be mentioned various low molecular weight compounds such as phthalic acid esters, triphenylphosphates and maleic acid esters. As the coatability improving agent, there may be mentioned a surfactant such as a fluorine type surfactant and a nonionic surfactant represented by ethyl cellulose and polyalkylene ether.

In the image-formable material of the present invention, a protective layer may be used, if necessary. As the protective layer, any known protective layer may be used. It is preferred that the protective layer is dissolved or dispersed in a developing solution during development. As a specific material for forming of the protective layer, polyvinyl alcohol or a cellulose may be used. Its gas permeability is selected suitably depending on the kind of the image-formable layer to be used. That is, when a light-sensitive composition which generates gas at the time of exposure such as o-quinonediazide is used in the image-formable layer, it is preferred to provide a protective layer having good gas permeability, and when a photopolymerization type light-sensitive composition which inhibits formation of an image by oxygen or the like in the air at the time of exposure is used in the image-formable layer, it is preferred to provide a protective layer having low gas permeability.

The film thickness of the protective layer is preferably about 0.01 to 5 μm, particularly preferably about 0.03 to 1 μm in consideration of influence on an effect thereof and a developing solution.

As a developing solution to be used for developing the image-formable material of the present invention, any developing solution may be used so long as it has an action of developing an image-formable material. As a specific example thereof and a development method, there may be mentioned a developing solution and a development method described in Japanese Provisional Patent Publication No. 92690/1995.

EXAMPLES

The present invention is described in detail by referring to Examples and Comparative examples, but the present invention is not limited by Examples described below.

<Preparation of supports having releasable cushion layer>

Supports each having a releasable cushion layer were prepared by using resins and methods in Table 1 shown below. The resins in Table 1 are as follows:

Low density polyethylenes MIRASON C-2499 and MIRASON 27 (trade names, each produced by Mitsui Sekiyu Kagaku Kogyo Co.)

Ethylene-vinyl acetate copolymer MIRASON 252 (trade name, produced by Mitsui Sekiyu Kagaku Kogyo Co.)

Low density polyolefin EXCELLEN VL200 (trade name, produced by Sumitomo Kagaku Kogyo Co.)

Ethylene-α-olefin copolymer ULTZEX 2005HC (trade name, produced by Mitsui Sekiyu Kagaku Kogyo Co.)

Medium density polyethylene NEO-ZEX 3510F (trade name, produced by Mitsui Sekiyu Kagaku Kogyo Co.)

High density polyethylene HI-ZEX 7000F (trade name, produced by Mitsui Sekiyu Kagaku Kogyo Co.)

Polypropylenes VIPOL F650, HIPOL J850Y and HIPOL J800 (trade names, each produced by Mitsui Sekiyu Kagaku Kogyo Co.)

Ethylene-vinyl acetate copolymers EVAFLEX P-1007, EVAFLEX P-1403, EVAFLEX P-1407 and EVAFLEX P-3307 (trade names, each produced by Mitsui Du Pont Polychemical Co.)

Si Coat 900A (trade name, produced by Daihachi Kagaku Kogyosho Co.)

Hydroxypropylmethyl cellulose TC-5 (trade name, produced by Shinetsu Kagaku Kogyo Co.)

Modified polypropylene Unistole Q (trade name, produced by Mitsui Sekiyu Kagaku Kogyo Co.)

Example 1

Color light-sensitive layer dispersions having the following composition were prepared.

Dispersion was carried out by passing the r espective components through a bulb homogenizer under a condition of 5 kgf/cm².

(Color light-sensitive layer dispersions)

| | |
|---|---|
| Esterified compound of p-cresol novolak resin and naphthoquinone-1,2-diazide-4-sulfonic acid chloride | 0.616 g |
| Vinyl acetate-vinyl versatate copolymer (weight ratio: 80:20, weight average molecular weight: 50,000, 50% methanol solution) | 8.768 g |
| Pigment shown below | Amount shown below |
| Methyl ethyl ketone | 35.2 g |

<Pigment>

| | |
|---|---|
| Black: Carbon Black MA-100 (trade name, produced by Mitsubishi Chemical Corporation) | 0.99 g |
| Cyan: Lionol Blue FG-7330 (trade name, produced by Toyo Ink Co.) | 0.55 g |
| Magenta: Lionol Red 6BFG-4219 (trade name, produced by Toyo Ink Co.) | 0.68 g |
| Yellow: Lionol Yellow No. 1206 (trade name, produced by Toyo Ink Co.) | 0.68 g |

On a releasable cushion layer of Sample No. 1 having a releasable cushion layer shown in Table 1, the above dispersions were coated to have a dry film thickness of 1.8 μm and dried, respectively, to obtain positive working type light-sensitive color image-formable materials of four colors.

Even when the color light-sensitive layer dispersions were coated and dried, the releasable cushion layer was not changed, and there was no problem in preparation.

Further, even when methyl ethyl ketone which was a solvent of the color light-sensitive layer dispersions was dropped on the releasable cushion layer, left to stand for 5 minutes and then wiped away, the surface of the releasable cushion layer was not changed.

On the polyethylene terephthalate film surfaces of the light-sensitive color image-formable materials of four colors obtained, color separation screen positive films of the respective colors were contacted closely so that images after development became reverse-reading images when seen from a light-sensitive layer side. Then, the materials obtained were subjected to image exposure for about 60 seconds from a distance of 50 cm by a 4 kw metal halide lamp and then developed by dipping them in a developing solution shown below at 32° C. for 30 seconds and rubbing them with a sponge to obtain color images of four colors in which exposed portions were removed.

(Developing solution)

| | |
|---|---|
| Konica PS printing developing solution SDP-1 (trade name, produced by Konica Corporation) | 40 ml |
| Pelex NB-L (trade name, produced by Kao Atlas Co., surfactant) | 100 ml |
| Distilled water | 400 ml |

Next, the image surface of the yellow color image and a matted paper Newage (trade name, produced by Shin-oji Seishi Co.) were contacted closely and passed between a pair of nip rolls heated to 80° C. under a pressurization condition of 5 kgf/cm$^2$ at a rate of 0.5 m/min. Immediately after passing between a pair of the nip rolls, the support was peeled off. Peeling was easily carried out at an interface of the cushion layer and the color image, and the yellow color image was transferred to the matted paper. Subsequently, the color images were transferred in the order of magenta, cyan and black, and entire exposure was carried out for about 120 seconds from a distance of 50 cm by a 4 kw metal halide lamp to obtain a color proofing image of four colors formed on the matted paper.

To the matted paper, only the color image portions were transferred. That is, the surface of the matted paper at a non-image portion was exposed and generation of background staining at the non-image portion was not observed.

Even when the temperature of the nip rolls at the time of transfer was changed from 80° C. to 85° C., images which were the same as those in the case where the temperature of the nip rolls was 80° C. were obtained.

The results of evaluation of difference between the color proofing image and a print obtained by using the same manuscript and paper by 15 persons skilled in printing are shown in Table 2-a. The print to be evaluated was obtained by using the same manuscript, the same matted paper Newage (trade name, produced by Shin-oji Seishi Co.), an ink Mark Five New (trade name, produced by Toyo Ink Co.) and a printer Mitsubishi DAIYA (trade name, manufactured by Mitsubishi Juko Co.). The results of measurement of gloss at the solid image portion of the color proofing image are shown in Table 2-a. Gloss was measured according to JISZ8741 (GS (75°))=Method 2 by using a digital goniophotometer VG-1D Model (trade name, manufactured by Nihon Denshoku Kogyo Co.). The results of evaluation of stability of image transfer temperature at the time of preparing the proofing image (at 75° C., 80° C., 85° C. and 90° C.) and the results of evaluation of suitability for forming the releasable cushion layer used are also shown in Tables 2-a and 2-b.

Examples 2 to 20 and Comparative examples 1 to 18

In the same manner as in Example 1 except for changing the sample having releasability used in Example 1 to those in Table 2-a shown below, light-sensitive image-formable materials were obtained and proofing images using said materials were obtained.

The proofing images and releasable cushion layers were evaluated in the same manner as in Example 1. The results are shown in Tables 2-a and 2-b.

Examples 21 to 40 and Comparative examples 19 to 36

On a polyethylene terephthalate film Lumilar T-60 (trade name, produced by Toray Co.) having a thickness of 75 μm, a layer having a thickness of 30 μm of polypropylene Hipole J800 (trade name, produced by Mitsui Sekiyu Kagaku Co.) was formed by the extrusion lamination method, whereby Sample No. 24 having a releasable cushion layer was obtained.

In the same manner as in Example 1 except for using Sample No. 24 in place of Sample No. 1, light-sensitive image-formable materials of four colors were obtained. On the polyethylene terephthalate film surfaces of the light-sensitive color image-formable materials of four colors obtained, color separation screen positive films of the respective colors were contacted closely so that images after development became right-reading images when seen from a light-sensitive layer side. Then, the materials obtained were subjected to image exposure for about 60 seconds from a distance of 50 cm by a 4 kw metal halide lamp and then developed in the same manner as in Example 1 to obtain color images in which exposed portions were removed.

Next, the image surface of the black color image and the releasable cushion layer surface of a sample in Table 3-a shown below which was used as an image-receiving sheet were contacted closely and passed between a pair of nip rolls heated to 80° C. under a pressurization condition of 5 kgf/cm$^2$ at a rate of 0.5 m/min. Thereafter, the support of the light-sensitive image-formable material was peeled off. Peeling was easily carried out at an interface of the cushion layer of the light-sensitive image-formable material and the color image, and the black color image was transferred to the image-receiving sheet. Subsequently, the color images were transferred in the order of cyan, magenta and yellow to obtain a color image of four colors formed on the image-receiving sheet.

Subsequently, the color image of four colors formed on the image-receiving sheet and a matted paper Newage (trade name, produced by Shin-oji Seishi Co.) were contacted closely and passed between a pair of nip rolls heated to 80° C. under a pressurization condition of 5 kgf/cm² at a rate of 0.5 m/min. Immediately after passing between a pair of the nip rolls, the support was peeled off in such a direction that an angle made by the support and a peeled surface was 150° or more. Peeling was easily carried out at an interface of the releasable cushion layer of the image-receiving sheet and the color image, and the color image of four colors was transferred to the matted paper. Entire exposure was carried out for about 120 seconds from a distance of 50 cm by a 4 kw metal halide lamp to obtain a proofing image of four colors formed on the matted paper.

The respective proofing images and releasable cushion layers were evaluated in the same manner as in Example 1. The results are shown in Tables 3-a and 3-b.

In Examples and Comparative examples described above, the respective releasable cushion layers were formed according to the following processes.

Process 1

(1) 5 g of an upper layer resin shown in Table 1 was added to 95 g of xylene and dissolved therein by heating. The resulting solution was cooled while stirring to precipitate a resin, whereby a dispersion in which the upper layer resin shown in Table 1 was dispersed in an organic solvent was obtained.

(2) The dispersion in which the upper layer resin was dispersed in an organic solvent obtained in (1) was coated on an untreated surface of a polyethylene terephthalate film T-100G (trade name, produced by Diafoil Hoechst Co., thickness: 38 μm) subjected to antistatic treatment so that the film thickness after drying became a film thickness shown in Table 1 and then dried in a dryer at 100° C. for 3 minutes to obtain a temporary support having a uniform coating film of the upper layer resin shown in Table 1 on the polyethylene terephthalate film.

(3) On a polyethylene terephthalate film Lumilar T-60 (trade name, produced by Toray Co.) having a thickness of 75 μm, a layer of a lower layer resin shown in Table 1 was formed so as to have a film thickness shown in Table 1 by the extrusion lamination method. Simultaneously, the coating film surface of the upper layer of the temporary support on which the upper layer had been coated obtained in (2) was superposed thereon. After cooling, only the polyethylene terephthalate film of the temporary support was removed by peeing to prepare a support having a releasable cushion layer comprising two layers.

Process 2

(1) 5 g of an upper layer resin shown in Table 1 was added to 95 g of xylene and dissolved therein by heating to obtain a hot solution containing the upper layer resin.

(2) While keeping the temperature of the hot solution containing the upper layer resin obtained in (1), said hot solution was coated on an untreated surface of a polyethylene terephthalate film T-100G (trade name, produced by Diafoil Hoechst Co., thickness: 38 μm) subjected to antistatic treatment so that the film thickness after drying became a film thickness shown in Table 1 and then dried in a dryer at 100° C. for 3 minutes to obtain a temporary support having a uniform coating film of the upper layer resin shown in Table 1 on the polyethylene terephthalate film.

(3) On a polyethylene terephthalate film Lumilar T-60 (trade name, produced by Toray Co.) having a thickness of 75 μm, a layer of a lower layer resin shown in Table 1 was formed so as to have a film thickness shown in Table 1 by the extrusion lamination method. Simultaneously, the coating film surface of the upper layer of the temporary support on which the upper layer had been coated obtained in (2) was superposed thereon. After cooling, only the polyethylene terephthalate film of the temporary support was removed by peeing to prepare a support having a releasable cushion layer comprising two layers.

Process 3

(1) 5 g of an upper layer resin shown in Table 1 was added to 95 g of xylene and dissolved therein by heating to obtain a hot solution containing the upper layer resin.

(2) On a polyethylene terephthalate film Lumilar T-60 (trade name, produced by Toray Co.) having a thickness of 75 μm, a layer of a lower layer resin shown in Table 1 was formed so as to have a film thickness shown in Table 1 by the extrusion lamination method.

(3) While keeping the temperature of the hot solution containing the upper layer resin obtained in (1), said hot solution was coated on the layer of the lower layer resin formed on the polyethylene terephthalate film so that the film thickness after drying became a film thickness shown in Table 1 and then dried in a dryer at 100° C. for 3 minutes. The resulting film was passed between a pair of smooth rolls heated to 100° C. under a pressurization condition of 1.2 kgf/cm² at a rate of 0.5 m/min to prepare a support having a releasable cushion layer comprising two layers.

Process 4

(1) 5 g of an upper layer resin shown in Table 1 was added to 95 g of xylene and dissolved therein by heating to obtain a hot solution containing the upper layer resin.

(2) On a polyethylene terephthalate film Lumilar T-60 (trade name, produced by Toray Co.) having a thickness of 75 μm, a layer of a lower layer resin shown in Table 1 was formed so as to have a film thickness shown in Table 1 by the extrusion lamination method.

(3) While keeping the temperature of the hot solution containing the upper layer resin obtained in (1), said hot solution was coated on the layer of the lower layer resin formed on the polyethylene terephthalate film so that the film thickness after drying became a film thickness shown in Table 1 and then dried in a dryer at 100° C. for 3 minutes. The resulting film was passed between a pair of smooth rolls heated to 75° C. under a pressurization condition of 1.2 kgf/cm² at a rate of 0.5 m/min to prepare a support having a releasable cushion layer comprising two layers.

Process 5

(1) 5 g of an upper layer resin shown in Table 1 was added to 95 g of xylene and dissolved therein by heating to obtain a hot solution containing the upper layer resin.

(2) On a polyethylene terephthalate film Lumilar T-60 (trade name, produced by Toray Co.) having a thickness of 75 μm, a layer of a lower layer resin shown in Table 1 was formed so as to have a film thickness shown in Table 1 by the extrusion lamination method.

(3) While keeping the temperature of the hot solution containing the upper layer resin obtained in (1), said hot solution was coated on the layer of the lower layer resin formed on the polyethylene terephthalate film so that the film thickness after drying became a film thickness shown in Table 1 and then dried in a dryer at 100° C. for 3 minutes. The resulting film was passed between a pair of smooth rolls heated to 75° C. under a pressurization condition of 0.5 kgf/cm² at a rate of 0.5 m/min to prepare a support having a releasable cushion layer comprising two layers.

Process 6

(1) On a polyethylene terephthalate film Lumilar T-60 (trade name, produced by Toray Co.) having a thickness of 75 μm, a layer of an upper layer resin and a layer of a lower layer resin shown in Table 1 were formed so as to have film thicknesses shown in Table 1, respectively, so that the layer of the lower layer resin was formed at a film side, by the co-extrusion lamination method.

Process 7

(1) 5 g of an upper layer resin shown in Table 1 was dissolved in 95 g of pure water to obtain an aqueous solution containing the upper layer resin.

(2) The aqueous solution containing the upper layer resin obtained in (1) was coated on an untreated surface of a polyethylene terephthalate film T-100G (trade name, produced by Diafoil Hoechst Co., thickness: 38 μm) subjected to antistatic treatment so that the film thickness after drying became a film thickness shown in Table 1 and then dried in a dryer at 100° C. for 3 minutes to obtain a temporary support having a uniform coating film of the upper layer resin shown in Table 1 on the polyethylene terephthalate film.

(3) On a polyethylene terephthalate film Lumilar T-60 (trade name, produced by Toray Co.) having a thickness of 75 μm, a layer of a lower layer resin shown in Table 1 was formed so as to have a film thickness shown in Table 1 by the extrusion lamination method. Simultaneously, the coating film surface of the upper layer of the temporary support on which the upper layer had been coated obtained in (2) was superposed thereon. After cooling, only the polyethylene terephthalate film of the temporary support was removed by peeing to prepare a support having a releasable cushion layer comprising two layers.

Process 8

(1) 5 g of an upper layer resin shown in Table 1 was dissolved in 95 g of pure water to obtain an aqueous solution containing the upper layer resin.

(2) The aqueous solution containing the upper layer resin obtained in (1) was coated on an untreated surface of a polyethylene terephthalate film T-100G (trade name, produced by Diafoil Hoechst Co., thickness: 38 μm) subjected to antistatic treatment so that the film thickness after drying became a film thickness shown in Table 1 and then dried in a dryer at 100° C. for 3 minutes to obtain a temporary support having a uniform coating film of the upper layer resin shown in Table 1 on the polyethylene terephthalate film.

(3) In 650 g of pure water were dissolved 50 g of formaldehyde, 150 g of concentrated sulfuric acid and 150 g of sodium sulfate, and the temperature of the resulting aqueous solution was kept at 60° C.

(4) The temporary support obtained in (2) was dipped in the aqueous solution prepared in (3) for 60 minutes and then dried.

(5) On a polyethylene terephthalate film Lumilar T-60 (trade name, produced by Toray Co.) having a thickness of 75 μm, a layer of a lower layer resin shown in Table 1 was formed so as to have a film thickness shown in Table 1 by the extrusion lamination method. Simultaneously, the coating film surface of the upper layer of the temporary support obtained in (4) was superposed thereon. After cooling, only the polyethylene terephthalate film of the temporary support was removed by peeing to prepare a support having a releasable cushion layer comprising two layers.

Process 9

(1) On a polyethylene terephthalate film Lumilar T-60 (trade name, produced by Toray Co.) having a thickness of 75 μm, a layer of a lower layer resin shown in Table 1 was formed so as to have a film thickness shown in Table 1 by the extrusion lamination method.

Process 10

(1) On a polyethylene terephthalate film Lumilar T-60 (trade name, produced by Toray Co.) having a thickness of 75 μm, a layer of a lower layer resin shown in Table 1 was formed so as to have a film thickness shown in Table 1 by the extrusion lamination method.

(2) A 30% by weight of methyl ethyl ketone solution containing an upper layer resin shown in Table 1 was coated on the layer of the lower layer resin formed on the polyethylene terephthalate film so that the film thickness after drying became a film thickness shown in Table 1 and then dried in a dryer at 120° C. for 3 minutes to prepare a support having a releasable cushion layer comprising two layers.

The respective proofing images and releasable cushion layers obtained in Examples and Comparative examples were evaluated as described below.

Evaluation items and evaluation standards

<Evaluation of suitability for forming releasable cushion layer>

Evaluation of solvent resistance

○: Any change of a surface is not observed when a dropped solvent is wiped away with a cloth.

Δ: The shape of a surface is changed (wrinkle, lifting or partial dissolution of an upper layer) when a dropped solvent is wiped away with a cloth.

X: An upper layer is removed when a dropped solvent is wiped away with a cloth.

Process load during formation (temperature keeping of an upper layer coating solution)

Not required: It is not required to keep (heat) a coating solution at a certain temperature or higher when an upper layer is coated.

Required: It is required to keep (heat) a coating solution at a certain temperature or higher when an upper layer is coated.

<Evaluation of proofing image (approximation to a print)> (evaluation was conducted by using an image formed at a transfer temperature of 80° C.)

Surface gloss at solid portion

An average value of measured values obtained by measuring gloss of 5 points at a solid portion of a proofing image by using the following apparatus and method Method: JIS-Z8741 (GS (75°))=Method 2

Apparatus: a digital goniophotometer VG-1D Model (trade name, manufactured by Nihon Denshoku Kogyo Co.)

Subjective evaluation (average opinion of evaluation)

According to the following standard, 15 persons skilled in printing evaluated difference between the respective images of four colors obtained and prints obtained by using the same manuscript with regard to the respective items shown in Tables 2-a and 3-a. The respective average values are shown as an average opinion of evaluation in Tables 2-a and 3-a.

Evaluation standard

5: No difference from a print is recognized.
(detectable limit)

4: A difference from a print is recognized, but ignorable.
(permissive limit)

3: A difference from a print cannot be ignored, but causes no inconvenience.
(tolerable limit)

2: A difference from a print causes inconvenience.

1: A difference from a print causes great inconvenience.

<Evaluation of stability of image transfer temperature (transfer temperature latitude)>

Transfer property at image portion

On the black image-formable materials among the color image-formable materials obtained in Examples and Comparative examples described above, screen tint color images were formed by subjecting said materials to imagewise exposure using 40% of a screen tint manuscript (175 lines/inch) and development. Transfer property was determined by the average number of transfer failure dots formed in an area of 10 cm×10 cm (at optional five points) when each of the flat screen color images was transferred to a final support at a temperature shown in Table 2-b or 3-b. As the number of transfer failure dots is smaller, transfer property at an image portion is better.

Peeling property at non-image portion

Among the color image-formable materials obtained in Examples and Comparative examples described above, the black image-formable materials were subjected to entire exposure and development to prepare exposed and developed color image-formable materials the entire surfaces of which were non-image portions. Peeling property and surface characteristics of a final support when each of the exposed and developed image-formable materials was transferred to a final support at a temperature shown in Table 2-b or 3-b and the releasable cushion layer was peeled off were evaluated according to the following standard.

◯: A releasable cushion layer can be peeled off easily without changing the surface of an image-receiving paper (peeling force: less than 3 kgf/m).

◯Δ: A releasable cushion layer can be peeled off without changing the surface of an image-receiving paper, but it is slightly difficult to carry out peeling (peeling force: 3 kgf/m or more).

Δ: A releasable cushion layer can be peeled off, but the surface of a partial image-receiving paper is changed (peeling or roughening of the surface).

ΔX: A releasable cushion layer can be peeled off, but a part of the releasable cushion layer is transferred to an image-receiving paper.

X: Adhesion between an image-receiving paper and a releasable cushion layer is strong, whereby peeling cannot be carried out.

TABLE 1

| Sample No. | Upper layer Kind of resin | Vicat softening point (°C.) | Calculated value of upper limit of film thickness | Film thickness (μm) | Lower layer Kind of resin | Vicat softening point (°C.) | Film thickness (μm) | Preparation method of cushion layer |
|---|---|---|---|---|---|---|---|---|
| 1A | Low density polyethylene MIRASON C-2499 | 81 | 3.42 | 5 | Ethylene-vinyl acetate copolymer EVAFLEX P-1047 | 62 | 30 | Method 1 |
| 1 | | | | 2 | | | | Method 2 |
| 2 | | | | | | | | Method 2 |
| 3 | | | | | | | | Method 3 |
| 4 | | | | | | | | Method 4 |
| 5 | | | | | | | | Method 5 |
| 6 | | | | | | | | Method 6 |
| 7A | Low density polyolefin EXCELLEN VL200 | 67 | 26.59 | 30 | | | | |
| 7 | | | | 20 | | | | |
| 8A | Low density polyethylene MIRASON 27 | 91 | 2.15 | 3.5 | | | | Method 2 |
| 8 | | | | 1.5 | | | | |
| 9A | Ethylene-α-olefin copolymer ULTZHEX 2005HC | 102 | 1.54 | 2.5 | | | | |
| 9 | | | | 1 | | | | |
| 10A | Medium density polyethylene NEO-ZEX 3510F | 114 | 1.19 | 2 | | | | |
| 10 | | | | 0.8 | | | | |
| 11A | High density polyethylene HI-ZEX 7000F | 124 | 1.01 | 1.5 | Ethylene-vinyl acetate copolymer EVAFLEX P-1407 | 62 | 30 | Method 2 |
| 11 | | | | 0.7 | | | | |
| 12A | Polypropylene HIPOL F650 | 125 | 0.99 | 1.2 | | | | |
| 12 | | | | 0.5 | | | | |
| 13A | Polypropylene HIPOL J850Y | 135 | 0.87 | 1.2 | | | | |
| 13 | | | | 0.5 | | | | |
| 14A | Polypropylene HIPOL J800 | 165 | 0.70 | 0.5 | | | | |
| 15A | Mixture of ethylene-vinyl acetate copolymer MIRASON 252 and low density polyethylene MIRASON C-2499 (1:1) | 80 | 3.64 | 5 | | | | |
| 15 | | | | 2 | | | | |
| 16A | Ethylene-vinyl acetate copolymer MIRASON 252 | 79 | 3.90 | 5 | Ethylene vinyl acetate copolymer EVAFLEX P-3307 | <40 | 25 | Method 6 |
| 16 | | | | 3 | | | | |
| 17A | | | | 5 | Ethylene-vinyl acetate copolymer EVAFLEX P-1407 | 62 | 30 | Method 2 |
| 17 | | | | 3 | | | | |
| 18A | Ethylene-vinyl acetate copolymer MIRASON 252 | 79 | 3.90 | 5 | Ethylene-vinyl acetate copolymer EVAFLEX P-1407 | 62 | 15 | Method 2 |
| 18 | | | | 3 | | | | |
| 19A | Ethylene-vinyl acetate copolymer EVAFLEX P-1007 | 71 | 8.94 | 10 | Ethylene-vinyl acetate copolymer EVAFLEX P-1407 | 62 | 20 | Method 6 |
| 19 | | | | 5 | | | | |
| 20A | | | | 10 | Ethylene-vinyl acetate copolymer EVAFLEX P-1403 | 68 | | |
| 20B | | | | 5 | | | | |
| 21A | Si Coat 900A (a thermally set resin when a coating film is formed) | >150 | | 1 | Modified polypropylene Unistole Q | 70< | 10 | Method 10 |
| 22 | Hydroxypropylmethyl cellulose TC-5 | — | | 1 | Ethylene-vinyl acetate copolymer EVAFLEX P-1407 | 62 | 30 | Method 7 |
| 23 | Formal compound of | — | | 1 | | | | Method 8 |

TABLE 1-continued

| | | Upper layer | | | Lower layer | | | Prepara- |
|---|---|---|---|---|---|---|---|---|
| Sample No. | Kind of resin | Vicat softening point (°C.) | Calculated value of upper limit of film thickness | Film thickness (μm) | Kind of resin | Vicat softening point (°C.) | Film thickness (μm) | tion method of cushion layer |
| 24A | hydroxypropylmethyl cellulose TC-5 None (single layer structure comprising lower layer alone) | — | — | — | | | | Method 9 |

TABLE 2-a

| | | Evaluation of suitability for forming releasable cushion layer | | | | Evaluation of proofing image (approximation to print) | | |
|---|---|---|---|---|---|---|---|---|
| | Sample No. | Evaluation of solvent resistance <Standing time after dropping of solvent> 1 min | 3 min | 5 min | Process load during formation = Temperature keeping of upper layer coating solution | Surface gloss at solid portion (JIS-Z8741) GS (75°) (average of five measurements) | Subjective evaluation (average opinion of evaluation) | |
| | | | | | | | Gloss (luster) at solid portion | Unevenness of gloss at solid portion = uniformity of upper layer film thickness |
| Comparative example 1 | 1A | ○ | ○ | ○ | Not required | 37 | 3.9 | 4.9 |
| Example 1 | 1 | ○ | ○ | ○ | Not required | 32 | 4.9 | 4.9 |
| Example 2 | 2 | ○ | ○ | ○ | Required | 32 | 4.8 | 4.9 |
| Example 3 | 3 | ○ | ○ | ○ | Required | 32 | 4.9 | 4.9 |
| Example 4 | 4 | ○ | ○ | Δ | Required | 32 | 4.8 | 4.9 |
| Example 5 | 5 | ○ | Δ | X | Required | 32 | 4.9 | 4.9 |
| Example 6 | 6 | ○ | ○ | ○ | Not required | 33 | 4.7 | 4.0 |
| Comparative example 2 | 7A | ○ | ○ | ○ | Not required | 37 | 3.8 | 3.8 |
| Example 7 | 7 | ○ | ○ | ○ | Not required | 34 | 4.4 | 4.4 |
| Comparative example 3 | 8A | ○ | ○ | ○ | Required | 37 | 3.9 | |
| Example 8 | 8 | ○ | ○ | ○ | Required | 33 | 4.7 | 4.8 |
| Comparative example 4 | 9A | ○ | ○ | ○ | Required | 36 | 4.0 | 4.8 |
| Example 9 | 9 | ○ | ○ | ○ | Required | 33 | 4.8 | 4.8 |
| Comparative example 5 | 10A | ○ | ○ | ○ | Required | 37 | 3.6 | 4.8 |
| Example 10 | 10 | ○ | ○ | ○ | Required | 33 | 4.7 | 4.8 |
| Comparative example 6 | 11A | ○ | ○ | ○ | Required | 37 | 3.6 | 4.8 |
| Example 11 | 11 | ○ | ○ | ○ | Required | 34 | 4.4 | 4.8 |
| Comparative example 7 | 12A | ○ | ○ | ○ | Required | 37 | 3.7 | 4.8 |
| Example 12 | 12 | ○ | ○ | ○ | Required | 36 | 4.0 | 4.8 |
| Comparative example 8 | 13A | ○ | ○ | ○ | Required | 39 | 3.0 | 4.8 |
| Example 13 | 13 | ○ | ○ | ○ | Required | 36 | 4.1 | 4.8 |
| Comparative example 9 | 14A | ○ | ○ | ○ | Required | 41 | 2.5 | 4.8 |
| Comparative example 10 | 15A | ○ | ○ | ○ | Required | 37 | 3.6 | 4.8 |
| Example 14 | 15 | ○ | ○ | ○ | Required | 34 | 4.4 | 4.8 |
| Comparative example 11 | 16A | ○ | ○ | ○ | Not required | 37 | 3.6 | 3.0 |
| Example 15 | 16 | ○ | ○ | ○ | Not required | 35 | 4.2 | 4.0 |
| Comparative example 12 | 17A | ○ | ○ | ○ | Required | 37 | 3.8 | 4.8 |
| Example 16 | 17 | ○ | ○ | ○ | Required | 35 | 4.2 | 4.8 |
| Comparative example 13 | 18A | ○ | ○ | ○ | Required | 41 | 2.4 | 4.8 |
| Example 17 | 18 | ○ | ○ | ○ | Required | 36 | 4.0 | 4.8 |
| Comparative example 14 | 19A | ○ | ○ | ○ | Not required | 36 | 4.0 | 3.0 |
| Example 18 | 19 | ○ | ○ | ○ | Not required | 34 | 4.4 | 4.0 |
| Comparative example 15 | 20A | ○ | ○ | ○ | Not required | 39 | 3.0 | 2.5 |
| Comparative | 20B | ○ | ○ | ○ | Not required | 37 | 3.6 | 3.0 |

TABLE 2-a-continued

| | | Evaluation of suitability for forming releasable cushion layer | | | | Evaluation of proofing image (approximation to print) | | | |
|---|---|---|---|---|---|---|---|---|---|
| | | Evaluation of solvent resistance <Standing time after dropping of solvent> | | | Process load during formation = Temperature keeping of upper layer coating solution | Surface gloss at solid portion (JIS-Z8741) GS (75°) (average of five measurements) | Subjective evaluation (average opinion of evaluation) | | |
| | Sample No. | 1 min | 3 min | 5 min | | | Gloss (luster) at solid portion | Unevenness of gloss at solid portion = uniformity of upper layer film thickness | |
| example 16 Comparative example 17 | 21A | Δ | X | X | Not required | 44 | 1.5 | 1.5 | |
| Example 19 | 22 | ○ | ○ | ○ | Not required | 34 | 4.4 | 4.8 | |
| Example 20 | 23 | ○ | ○ | ○ | Not required | 34 | 4.3 | 4.8 | |
| Comparative example 18 | 24A | ○ | ○ | ○ | — | 32 | 4.9 | 4.9 | |
| Print | — | — | — | — | — | 32 | — | — | |

TABLE 2-b

| | | Evaluation of stability of image transfer temperature (transfer temperature latitude) | | | | | | | |
|---|---|---|---|---|---|---|---|---|---|
| | | Transfer property at image portion <Number of transfer failure dots> (in 10 cm × 10 cm: average of five measurements) | | | | Peeling property at non-image portion | | | |
| | Sample No. | Transfer at 70° C. | Transfer at 75° C. | Transfer at 80° C. | Transfer at 85° C. | Transfer at 70° C. | Transfer at 75° C. | Transfer at 80° C. | Transfer at 85° C. |
| Comparative example 1 | 1A | 95 | 30 | 0 | 0 | ○ | ○ | ○ | ○Δ |
| Example 1 | 1 | 25 | 0 | 0 | 0 | ○ | ○ | ○ | ○Δ |
| Example 2 | 2 | 25 | 0 | 0 | 0 | ○ | ○ | ○ | ○Δ |
| Example 3 | 3 | 25 | 0 | 0 | 0 | ○ | ○ | ○ | ○Δ |
| Example 4 | 4 | 26 | 0 | 0 | 0 | ○ | ○ | ○ | ○Δ |
| Example 5 | 5 | 30 | 0 | 0 | 0 | ○ | ○ | ○ | ΔX |
| Example 6 | 6 | 25 | 0 | 0 | 0 | ○ | ○ | ○ | ○Δ |
| Comparative example 2 | 7A | 91 | 30 | 0 | 0 | ○ | ○ | ○ | ○Δ |
| Example 7 | 7 | 28 | 0 | 0 | 0 | ○ | ○ | ○ | ○Δ |
| Comparative example 3 | 8A | 113 | 40 | 0 | 0 | ○ | ○ | ○ | ○Δ |
| Example 8 | 8 | 28 | 0 | 0 | 0 | ○ | ○ | ○ | ○Δ |
| Comparative example 4 | 9A | 105 | 35 | 0 | 0 | ○ | ○ | ○ | ○Δ |
| Example 9 | 9 | 26 | 0 | 0 | 0 | ○ | ○ | ○ | ○Δ |
| Comparative example 5 | 10A | 108 | 35 | 0 | 0 | ○ | ○ | ○ | ○Δ |
| Example 10 | 10 | 27 | 0 | 0 | 0 | ○ | ○ | ○ | ○Δ |
| Comparative example 6 | 11A | 130 | 45 | 0 | 0 | ○ | ○ | ○ | ○Δ |
| Example 11 | 11 | 29 | 0 | 0 | 0 | ○ | ○ | ○ | ○Δ |
| Comparative example 7 | 12A | 125 | 40 | 0 | 0 | ○ | ○ | ○ | ○Δ |
| Example 12 | 12 | 29 | 0 | 0 | 0 | ○ | ○ | ○ | ○Δ |
| Comparative example 8 | 13A | 158 | 60 | 0 | 0 | ○ | ○ | ○ | ○Δ |
| Example 13 | 13 | 35 | 0 | 0 | 0 | ○ | ○ | ○ | ○Δ |
| Comparative example 9 | 14A | 104 | 30 | 0 | 0 | ○ | ○ | ○ | ○Δ |
| Comparative example 10 | 15A | 175 | 50 | 0 | 0 | ○ | ○ | ○ | ○Δ |
| Example 14 | 15 | 40 | 0 | 0 | 0 | ○ | ○ | ○ | ○Δ |
| Comparative example 11 | 16A | 78 | 10 | 0 | 0 | ○ | ○ | ○ | Δ |
| Example 15 | 16 | 25 | 0 | 0 | 0 | ○ | ○ | ○ | Δ |
| Comparative example 12 | 17A | 110 | 20 | 0 | 0 | ○ | ○ | ○ | Δ |
| Example 16 | 17 | 29 | 0 | 0 | 0 | ○ | ○ | ○ | Δ |
| Comparative example 13 | 18A | 180 | 60 | 20 | 0 | ○ | ○ | ○ | Δ |
| Example 17 | 18 | 51 | 10 | 0 | 0 | ○ | ○ | ○ | Δ |
| Comparative | 19A | 111 | 40 | 15 | 0 | ○ | ○ | ○Δ | Δ |

TABLE 2-b-continued

Evaluation of stability of image transfer temperature (transfer temperature latitude)

| | Sample No. | Transfer property at image portion <Number of transfer failure dots> (in 10 cm × 10 cm: average of five measurements) | | | | Peeling property at non-image portion | | | |
|---|---|---|---|---|---|---|---|---|---|
| | | Transfer at 70° C. | Transfer at 75° C. | Transfer at 80° C. | Transfer at 85° C. | Transfer at 70° C. | Transfer at 75° C. | Transfer at 80° C. | Transfer at 85° C. |
| example 14 | | | | | | | | | |
| Example 18 | 19 | 31 | 0 | 0 | 0 | ○ | ○ | ○△ | △ |
| Comparative example 15 | 20A | 224 | 80 | 40 | 5 | ○ | ○ | ○△ | △ |
| Comparative example 16 | 20B | 155 | 56 | 30 | 2 | ○ | ○ | ○△ | △ |
| Comparative example 17 | 21A | 321 | 115 | 51 | 25 | ○ | ○ | ○ | △X |
| Example 19 | 22 | 61 | 3 | 0 | 0 | 0 | ○ | ○ | ○△ |
| Example 20 | 23 | 58 | 4 | 0 | 0 | 0 | ○ | ○ | ○ |
| Comparative example 18 | 24A | 20 | 0 | 0 | 0 | ○ | ○△ | △ | X |
| Print | — | — | — | — | — | — | — | — | — |

TABLE 3-a

| | Sample No. | Evaluation of suitability for forming releasable cushion layer | | | | Evaluation of proofing image (approximation to print) | | |
|---|---|---|---|---|---|---|---|---|
| | | Evaluation of solvent resistance <Standing time after dropping of solvent> | | | Process load during formation = Temperature keeping of upper layer coating | Surface gloss at solid portion (JIS-Z8741) GS (75°) (average of five measurements) | Subjective evaluation (average opinion of evaluation) | |
| | | 1 min | 3 min | 5 min | solution | | Gloss (luster) at solid portion | Unevenness of gloss at solid portion = uniformity of upper layer film thickness |
| Comparative example 19 | 1A | ○ | ○ | ○ | Not required | 39 | 3.0 | 4.9 |
| Example 21 | 1 | ○ | ○ | ○ | Not required | 32 | 4.9 | 4.9 |
| Example 22 | 2 | ○ | ○ | ○ | Required | 33 | 4.8 | 4.9 |
| Example 23 | 3 | ○ | ○ | ○ | Required | 32 | 4.8 | 4.9 |
| Example 24 | 4 | ○ | ○ | △ | Required | 33 | 4.9 | 4.9 |
| Example 25 | 5 | ○ | △ | X | Required | 33 | 4.8 | 4.9 |
| Example 26 | 6 | ○ | ○ | ○ | Not required | 34 | 4.6 | 4.0 |
| Comparative example 20 | 7A | ○ | ○ | ○ | Not required | 37 | 3.5 | 3.8 |
| Example 27 | 7 | ○ | ○ | ○ | Not required | 35 | 4.2 | 4.4 |
| Comparative example 21 | 8A | ○ | ○ | ○ | Required | 38 | 3.3 | 4.8 |
| Example 28 | 8 | ○ | ○ | ○ | Required | 34 | 4.5 | 4.8 |
| Comparative example 22 | 9A | ○ | ○ | ○ | Required | 37 | 3.7 | 4.8 |
| Example 29 | 9 | ○ | ○ | ○ | Required | 32 | 4.8 | 4.8 |
| Comparative example 23 | 10A | ○ | ○ | ○ | Required | 38 | 3.2 | 4.8 |
| Example 30 | 10 | ○ | ○ | ○ | Required | 33 | 4.7 | 4.8 |
| Comparative example 24 | 11A | ○ | ○ | ○ | Required | 39 | 3.1 | 4.8 |
| Example 31 | 11 | ○ | ○ | ○ | Required | 34 | 4.4 | 4.8 |
| Comparative example 25 | 12A | ○ | ○ | ○ | Required | 38 | 3.6 | 4.8 |
| Example 32 | 12 | ○ | ○ | ○ | Required | 35 | 4.1 | 4.8 |
| Comparative example 26 | 13A | ○ | ○ | ○ | Required | 40 | 3.0 | 4.8 |
| Example 33 | 13 | ○ | ○ | ○ | Required | 36 | 4.1 | 4.8 |
| Comparative example 27 | 14A | ○ | ○ | ○ | Required | 43 | 2.7 | 4.8 |
| Comparative example 28 | 15A | ○ | ○ | ○ | Required | 37 | 3.8 | 4.8 |
| Example 34 | 15 | ○ | ○ | ○ | Required | 34 | 4.4 | 4.8 |
| Comparative example 29 | 16A | ○ | ○ | ○ | Not required | 38 | 3.5 | 3.0 |
| Example 35 | 16 | ○ | ○ | ○ | Not required | 35 | 4.2 | 4.0 |
| Comparative | 17A | ○ | ○ | ○ | Required | 37 | 3.8 | 4.8 |

TABLE 3-a-continued

| | Sample No. | Evaluation of suitability for forming releasable cushion layer | | | | Evaluation of proofing image (approximation to print) | | |
|---|---|---|---|---|---|---|---|---|
| | | Evaluation of solvent resistance <Standing time after dropping of solvent> | | | Process load during formation = Temperature keeping of upper layer coating | Surface gloss at solid portion (JIS-Z8741) GS (75°) (average of five measurements) | Subjective evaluation (average opinion of evaluation) | |
| | | 1 min | 3 min | 5 min | solution | | Gloss (luster) at solid portion | Unevenness of gloss at solid portion = uniformity of upper layer film thickness |
| Example 30 | | | | | | | | |
| Example 36 | 17 | ○ | ○ | ○ | Required | 35 | 4.2 | 4.8 |
| Comparative example 31 | 18A | ○ | ○ | ○ | Required | 42 | 2.5 | 4.8 |
| Example 37 | 18 | ○ | ○ | ○ | Required | 36 | 4.0 | 4.8 |
| Comparative example 32 | 19A | ○ | ○ | ○ | Not required | 37 | 4.0 | 3.0 |
| Example 38 | 19 | ○ | ○ | ○ | Not required | 34 | 4.5 | 4.0 |
| Comparative example 33 | 20A | ○ | ○ | ○ | Not required | 40 | 3.0 | 2.5 |
| Comparative example 34 | 20B | ○ | ○ | ○ | Not required | 38 | 3.6 | 3.0 |
| Comparative example 35 | 21A | Δ | X | X | Not required | 44 | 1.4 | 1.5 |
| Example 39 | 22 | ○ | ○ | ○ | Not required | 35 | 4.3 | 4.8 |
| Example 40 | 23 | ○ | ○ | ○ | Not required | 34 | 4.4 | 4.8 |
| Comparative example 36 | 24A | ○ | ○ | ○ | — | 32 | 4.9· | 4.9 |
| Print | — | — | — | — | — | 32 | — | — |

TABLE 3-b

| | Sample No. | Evaluation of stability of image transfer temperature (transfer temperature latitude) | | | | | | | |
|---|---|---|---|---|---|---|---|---|---|
| | | Transfer property at image portion <Number of transfer failure dots> (in 10 cm × 10 cm: average of five measurements) | | | | Peeling property at non-image portion | | | |
| | | Transfer at 70° C. | Transfer at 75° C. | Transfer at 80° C. | Transfer at 85° C. | Transfer at 70° C. | Transfer at 75° C. | Transfer at 80° C. | Transfer at 85° C. |
| Comparative example 19 | 1A | 102 | 37 | 0 | 0 | ○ | ○ | ○ | ○Δ |
| Example 21 | 1 | 29 | 0 | 0 | 0 | ○ | ○ | ○ | ○Δ |
| Example 22 | 2 | 30 | 0 | 0 | 0 | ○ | ○ | ○ | ○Δ |
| Example 23 | 3 | 31 | 0 | 0 | 0 | ○ | ○ | ○ | ○Δ |
| Example 24 | 4 | 29 | 0 | 0 | 0 | ○ | ○ | ○ | ○Δ |
| Example 25 | 5 | 38 | 0 | 0 | 0 | ○ | ○ | ○ | ΔX |
| Example 26 | 6 | 35 | 0 | 0 | 0 | ○ | ○ | ○ | ○Δ |
| Comparative example 20 | 7A | 100 | 34 | 0 | 0 | ○ | ○ | ○ | ○Δ |
| Example 27 | 7 | 33 | 0 | 0 | 0 | ○ | ○ | ○ | ○Δ |
| Comparative example 21 | 8A | 133 | 43 | 0 | 0 | ○ | ○ | ○ | ○Δ |
| Example 28 | 8 | 38 | 0 | 0 | 0 | ○ | ○ | ○ | ○Δ |
| Comparative example 22 | 9A | 114 | 43 | 0 | 0 | ○ | ○ | ○ | ○Δ |
| Example 29 | 9 | 35 | 0 | 0 | 0 | ○ | ○ | ○ | ○Δ |
| Comparative example 23 | 10A | 119 | 41 | 0 | 0 | ○ | ○ | ○ | ○Δ |
| Example 30 | 10 | 32 | 0 | 0 | 0 | ○ | ○ | ○ | ○Δ |
| Comparative example 24 | 11A | 150 | 49 | 0 | 0 | ○ | ○ | ○ | ○Δ |
| Example 31 | 11 | 36 | 0 | 0 | 0 | ○ | ○ | ○ | ○Δ |
| Comparative example 25 | 12A | 138 | 48 | 0 | 0 | ○ | ○ | ○ | ○Δ |
| Example 32 | 12 | 31 | 0 | 0 | 0 | ○ | ○ | ○ | ○Δ |
| Comparative example 26 | 13A | 164 | 60 | 11 | 0 | ○ | ○ | ○ | ○Δ |
| Example 33 | 13 | 44 | 0 | 0 | 0 | ○ | ○ | ○ | ○Δ |
| Comparative example 27 | 14A | 124 | 40 | 0 | 0 | ○ | ○ | ○ | ○Δ |
| Comparative | 15A | 178 | 55 | 4 | 0 | ○ | ○ | ○ | ○Δ |

TABLE 3-b-continued

| | | Evaluation of stability of image transfer temperature (transfer temperature latitude) | | | | | | | |
|---|---|---|---|---|---|---|---|---|---|
| | Sam- | Transfer property at image portion <Number of transfer failure dots> (in 10 cm × 10 cm: average of five measurements) | | | | Peeling property at non-image portion | | | |
| | ple No. | Transfer at 70° C. | Transfer at 75° C. | Transfer at 80° C. | Transfer at 85° C. | Transfer at 70° C. | Transfer at 75° C. | Transfer at 80° C. | Transfer at 85° C. |
| example 28 | | | | | | | | | |
| Example 34 | 15 | 50 | 0 | 0 | 0 | ○ | ○ | ○ | ○△ |
| Comparative example 29 | 16A | 86 | 12 | 0 | 0 | ○ | ○ | ○ | △ |
| Example 35 | 16 | 30 | 0 | 0 | 0 | ○ | ○ | ○ | △ |
| Comparative example 30 | 17A | 123 | 22 | 0 | 0 | ○ | ○ | ○ | △ |
| Example 36 | 17 | 30 | 0 | 0 | 0 | ○ | ○ | ○ | △ |
| Comparative example 31 | 18A | 202 | 69 | 22 | 0 | ○ | ○ | ○ | △ |
| Example 37 | 18 | 66 | 14 | 0 | 0 | ○ | ○ | ○ | △ |
| Comparative example 32 | 19A | 119 | 53 | 18 | 0 | ○ | ○ | ○△ | △ |
| Example 38 | 19 | 32 | 0 | 0 | 0 | ○ | ○ | ○△ | △ |
| Comparative example 33 | 20A | 246 | 96 | 49 | 6 | ○ | ○ | ○△ | △ |
| Comparative example 34 | 20B | 175 | 66 | 40 | 2 | ○ | ○ | ○△ | △ |
| Comparative example 35 | 21A | 364 | 134 | 61 | 30 | ○ | ○ | ○ | △X |
| Example 39 | 22 | 63 | 3 | 0 | 0 | ○ | ○ | ○ | ○△ |
| Example 40 | 23 | 68 | 5 | 0 | 0 | ○ | ○ | ○ | ○ |
| Comparative example 36 | 24A | 22 | 0 | 0 | 0 | ○ | ○△ | △ | X |
| Print | — | — | — | — | — | — | — | — | — |

According to the present invention, there can be provided an image-formable material and an image-receiving sheet material which can give excellent approximation to a print, a wide latitude of image transfer temperature, good image portion-transferring property and excellent suitability for forming a releasable cushion layer, and a process for forming a releasable cushion layer to be provided in the above materials.

We claim:

1. An image-formable material which comprises a support provided thereon a releasable cushion layer and an image-formable layer in this order, wherein the image-formable layer can be peeled off from the releasable cushion layer, the image-formable layer is transferable, and the releasable cushion layer comprises two or more layers and satisfies all of the following conditions (1), (2) and (3):

(1) a lower layer itself has a Vicat softening temperature measured according to JIS-K7206 of 65° C. or lower;

(2) 65° C.<Vicat softening temperature measured according to JIS-K7206 of uppermost layer resin ≦150° C.; and (3) film thickness (μm) of uppermost layer <[10log{(X-65)/230+1}]$^{-1}$ wherein X represents a Vicat softening temperature measured according to JIS-K7206 of an uppermost layer resin.

2. The material of claim 1 wherein the uppermost layer contains a polyolefin.

3. An image-formable material which comprises a support provided thereon a releasable cushion layer and an image-formable layer in this order, wherein the image-formable layer can be peeled off from the releasable cushion layer, the image-formable layer is transferable, the releasable cushion layer comprises two or more layers, and an uppermost layer contains a cellulose or a derivative thereof.

4. The material of claim 1 wherein said releasable cushion layer and said image formable layer are in contact with each other.

* * * * *